United States Patent [19]
Chappell et al.

[11] Patent Number: 5,649,170
[45] Date of Patent: Jul. 15, 1997

[54] INTERCONNECT AND DRIVER OPTIMIZATION FOR HIGH PERFORMANCE PROCESSORS

[75] Inventors: Barbara Alane Chappell, Portland, Oreg.; Parsotam Trikam Patel; Phoung Kim Phan, both of Austin, Tex.; George Anthony Sai Halasz, Mount Kisco, N.Y.

[73] Assignee: International Business Machines Corporation, Armonk, N.Y.

[21] Appl. No.: 497,175

[22] Filed: Jun. 30, 1995

[51] Int. Cl.$^6$ ................................................ H03H 11/26
[52] U.S. Cl. ................................................ 395/500
[58] Field of Search ................................ 364/468, 488, 364/489, 490, 491; 307/572; 395/500

[56] References Cited

U.S. PATENT DOCUMENTS

| | | |
|---|---|---|
| 4,636,813 | 1/1987 | Mego et al. . |
| 5,122,693 | 6/1992 | Honda et al. . |
| 5,278,466 | 1/1994 | Honoa et al. . |
| 5,280,474 | 1/1994 | Nickolls et al. . |

OTHER PUBLICATIONS

Menezes, Noel and Lawrence Pillage. *Simultaneous Gate and Interconnect Sizing for Circuit–Level Delay Optimization.* submitted for publication Feb. 2, 1995.

Zhou et al., *Interconnection Delay in Very High–Speed VLSI* IEEE Transactions on Circuits and Systems, vol. 38, No. 7, Jul. 1991.

*Primary Examiner*—Kevin J. Teska
*Assistant Examiner*—Dan Fiul
*Attorney, Agent, or Firm*—Whitham, Curtis, Whitham & McGinn; Robert P. Tassinari, Jr.

[57] ABSTRACT

A method for determining an optimal design for wiring interconnect and driver power for a designed target delay begins at the floor planning stages of the chip design and may be repeated during the design process. The designer initially specifies a maximum width that wires are allowed to use and a target delay value. Then the designer gives values to weights used in the calculation of an optimization function G(d,p,w), where d is the delay, p is the power, and w is wire width. An "ideal" slope $$\frac{\Delta \text{delay}}{\text{delay}} \over \frac{\Delta \text{driver}}{\text{driver}}$$

is calculated, assuming zero resistance.

The designer chooses a slope decrease value from the "ideal" slope value. For each set wire width, the delay (at the proper slope) belonging to that particular wire width is obtained. With these inputs, an optimization program according to the invention is run. This program then calculates values of the function G(d,p,w) for increasing wire pitches, starting with the minimum allowed by the technology. The process continues until (1) the target delay is set by the designer is met, (2) the largest pitch value allowed by the designer is reached, or (3) further calculation will not yield a smaller value for the optimization function.

9 Claims, 3 Drawing Sheets

INTERCONNECT AND DRIVER OPTIMIZATION FOR HIGH PERFORMANCE PROCESSORS

BACKGROUND OF THE INVENTION

1. Field of the Invention

The present invention generally relates to the design of high performance very large scale integrated (VLSI) circuits such as microprocessors and, more particularly, to a computer-method for determining an optimal design for wiring interconnect and driver power. The method is run at the floor planning stage of the chip and may be run as the circuit design progresses.

2. Background Description

As cycle times in complementary metal oxide semiconductor (CMOS) processors becomes shorter, signal delays due to wire resistances are becoming a performance concern. Attempts have been made in some CMOS designs to solve this problem by utilizing large drivers and wires having wider widths than the minimum design values. While signal delays can be made shorter by increasing driver size and increasing wire widths, there are inherent dangers involved in this procedure. Driver size and line width are "expensive" commodities in chip design. One does not want to use either larger drivers or wider wires than absolutely necessary. For a given wire resistance and load combination, increasing driver size results in ever decreasing returns in delay while power consumption increases. The reason is that the wire resistance "shields" the load from the driver. There is a similar situation when wire width increases. The advantage in reducing delay by increasing wire width eventually diminishes as well because as wire resistance is reduced with increasing wire width, wire capacitance increases. There is therefore a need for a procedure to consistently choose driver sizes and wire widths so as to improve the delay in a manner which is affordable from a chip power and wiring budget point of view.

SUMMARY OF THE INVENTION

It is therefore an object of the present invention to provide a method for determining an optimal design for wiring interconnect and driver power level combinations for all nets in a complex CMOS circuit such as a processor.

According to the invention, an optimal driver size is consistently obtained for any given wire resistance in terms of percentage delay improvement in response to driver power increases. The method according to the invention finds the delays at these optimal driver size and wire width combinations. Thus, for any allowed wire width of the given technology (the maximum allowed wire width is set by global considerations by the chip designers once and for all), based on the optimal driver size, the first part of the procedure finds a set of three parameters; namely, the wire size, w, the driver power, p, and the delay, d. Of the several sets of these three variables, w, p and d, the optimal set is the one which minimizes a special function G(d,p,w). This G(d,p,w) function mathematically weights the advantage of decreasing the delay, d, against the disadvantages of power expenditure, p, due to increasing driver size, and the wiring track expenditure, w, due to the use of wider than minimum size wire widths. For a particular wire net, the procedure is performed until one of the following conditions is encountered: (1) A globally preset delay value is reached at an allowed wire width at a driver power that is even smaller than would be allowed based on optimization criteria on drivers. (2) A minimum is reached in the G(d,p,w) function from the obtained sets of the parameters d, p and w.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
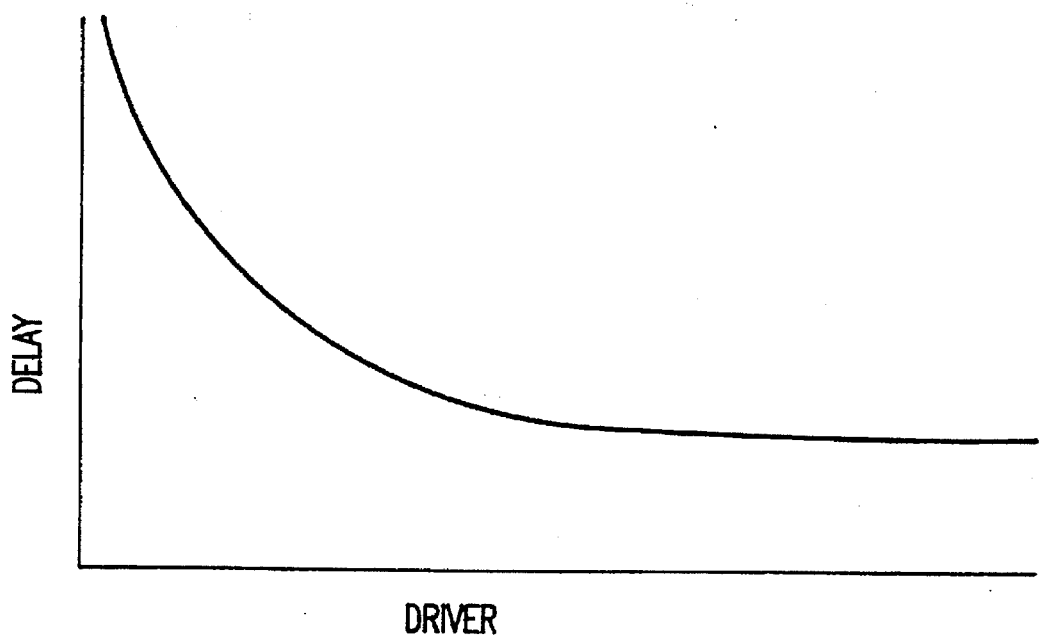
FIG. 1 is a graph showing delay as a function of driver width.
Figure 2:
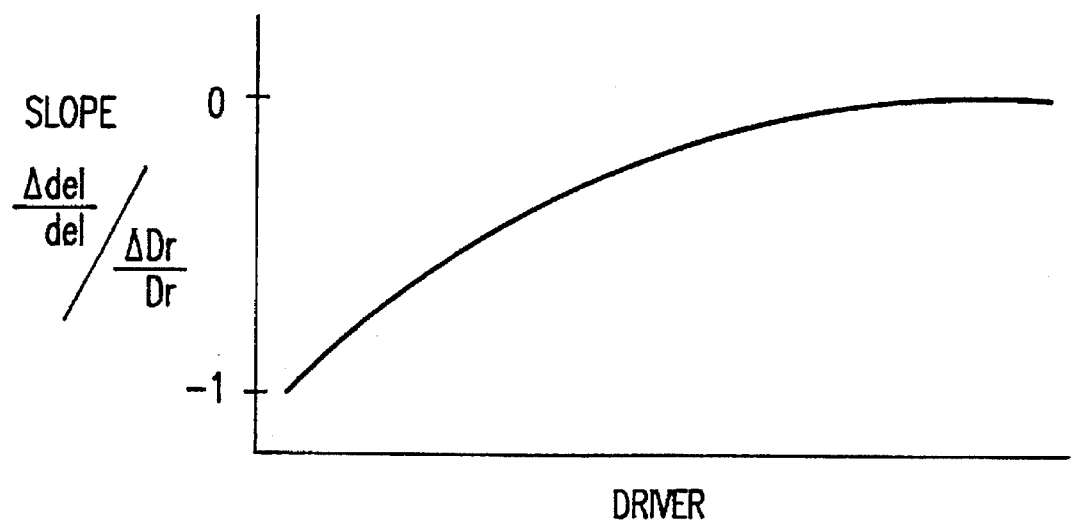
FIG. 2 is a graph showing a relative slope as a function of driver width.

For a given load and wire-net (a wire-net connects one source pin with one or more sink pins), the delay, d, as a function of driver size (i.e., power, p) is a smooth function. While driver size tending to end in zero delay goes toward infinity, in the limit of infinite driver size, the delay asymptote has a finite value, as shown in FIG. 1. At any point along the curve, a relative slope $$\frac{\frac{\Delta \text{delay}}{\text{delay}}}{\frac{\Delta \text{driver}}{\text{driver}}} \quad \text{or} \quad \frac{\frac{\Delta d}{d}}{\frac{\Delta p}{p}}$$

can be obtained. In other words, the relative slope is the percentage decrease one obtains in delay divided by the percentage increase in driver size (i.e., power) that caused the delay change. This slope is also a smooth function of driver size. For small drivers, it is a value close to one. This slope is always negative because driver a size increase causes a delay decrease, but to simplify the discussion, absolute values will be used. For large drivers, the relative slope tends to zero because no matter how much the driver size increases, delay stays unchanged, as shown in FIG. 2.

It is desirable to have short delays with large slope. This would mean fast signal propagation with minimum power consumption. As it happens, a natural slope value of special importance can be found which can serve to gauge subsequent slopes. Suppose the resistance of the wire were zero and the load were purely capacitive, consisting of the sum of the wire capacitances and sink capacitances. Again, one can calculate the value of $$\frac{\frac{\Delta \text{delay}}{\text{delay}}}{\frac{\Delta \text{driver}}{\text{driver}}}$$

for the target delay of the chip design. This is defined as the "ideal" slope, but with wire resistance in reality not being zero, this slope can only be approached in practice. Accordingly, under real conditions with resistive wires, the merit of driver size increase is defined relative to this "ideal" slope.

An illustrative case is as follows. A goal may be to reach a 100 ps delay between a source and sink pins in a given chip design. The "ideal" slope, $$\frac{\Delta\text{delay}}{\text{delay}} \over \frac{\Delta\text{driver}}{\text{driver}},$$

at a driver size which gives 100 ps delay, is computed, assuming the net has zero resistance. Suppose that the computed "ideal" slope is 0.7, which for this discussion is a typical value for the "ideal" slope. Having computed the "ideal" slope, a consistent design criteria can be defined by requiring driver sizes at the source pins such that the slope becomes a given fraction of the computed "ideal" slope. This "slope decrease" (i.e., fraction) becomes an important design parameter. A value of 0.5 for the "slope decrease" for example, is an aggressive high power, high performance design factor. Such a design factor means that we are willing to increase driver sizes to the extent that we accept a fractional improvement in delay which is only half as good in response to driver size increase as if the load were purely capacitive.

For a given slope decrease, the delay, and driver size, is different depending on wire width. For wider wires, there is less delay and larger drivers. Consequently, for any value set for slope decrease, there is a further trade-off to be made between minimizing delay at the expense of power consumption and the use of wiring channels. The wiring channels in a chip design is a finite and precious resource. This trade-off is made by defining a function G(d,p,w), where d is delay, p is power, and w is wire width or pitches on wire planes where the net is running. The relative weights given to the variables d, p and w define the extent a given chip design emphasizes speed or power and smaller chip size. Thus, the problem of designing chip interconnects in a consistent way is reduced to an optimization problem of finding a minimum in the function G(d,p,w). Increasing the values of the variable p and/or w leads to decreasing the variable d.

Figure 3:
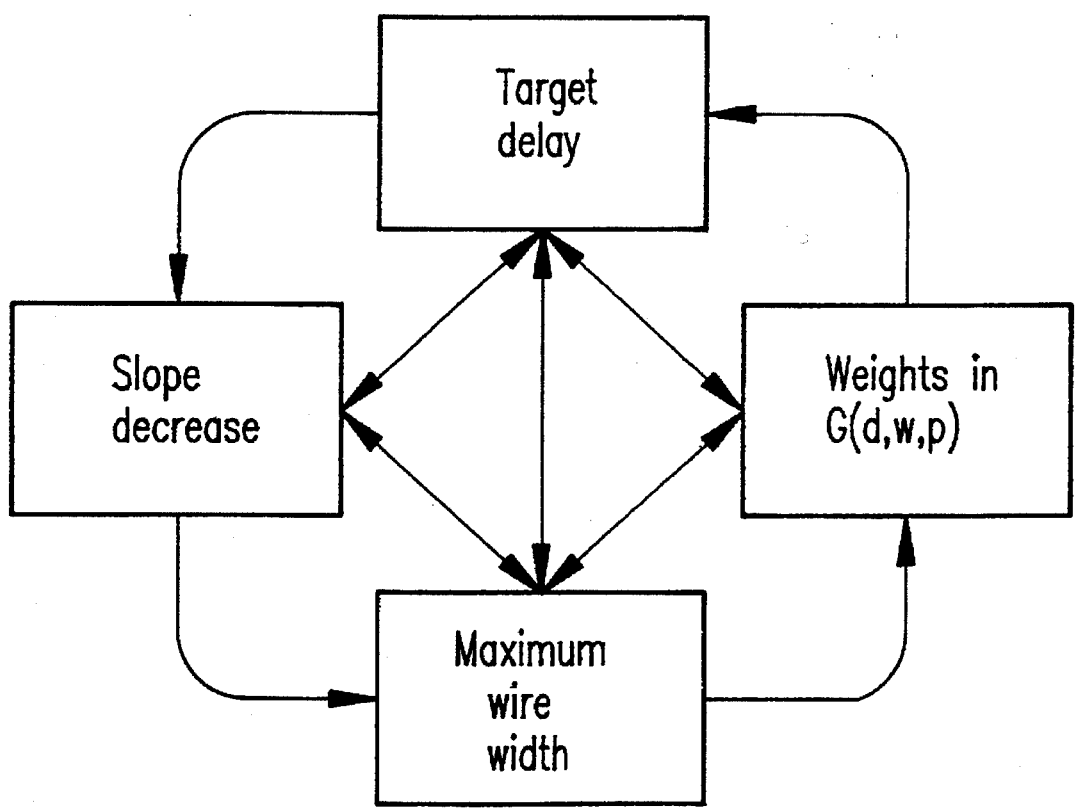
FIG. 3 is a state diagram illustrating the process of implementing the design algorithm according to the invention.

Early in the design, together with the global floorplanning, the chief designer has to settle on the desired target delay, the maximum wire width allowed, the slope decrease parameter, and the weights in the G(d,p,w) function. The target delay and maximum wire width are well bracketed at an early stage of chip planning. For instance, one wants 100 ps per driver and wire delay because this is what a planned cycle time dictates. Maximum wire width, for instance, four times the minimum given by the technology, is dictated by wirability requirements. FIG. 3 shows how the four globally set parameters influence each other.

1. For a given slope decrease, one finds the delays for all the allowed wire widths for a few, maybe three to five, critical nets.
2. The slope decrease, target delay and maximum wire width are adjusted until for these few selected nets delay, driver size, and wire width are judged satisfactory by the chief designer.
3. The weights in the G(d,p,w) function are adjusted such that for the few selected nets, G(d,p,w) has a minimum just at those delays, driver sizes, and wire widths which were decided in step two above as the satisfactory combinations.
4. With the weights now settled, all the (typically thousands) nets can be run to find all the delays, wire widths, and driver sizes. Now global considerations enter, regarding total chip power, total wiring, and wire delay impact on cycle time. If any of these are not satisfactory, one goes back to step one above and readjusts one of the starting assumptions. For instance, the target delay might be relaxed from 100 to 120 ps. Then the nets are run again to see if the global considerations are satisfied.

With this procedure, the main design parameters are set, and when the chip is in the detailed design state, the designer knows within a few percent what size driver will be needed and how wide a wire will be used. In the detailed stage of the chip design, the placement and loadings usually are changed somewhat and the driver/wire tuning procedure is redone each time. But since deviations from the detailed early placement stage are minimal, these changes will not impact global considerations when they are adjusted to achieve the needed final precision of the design.

An example of the form the function G(d,p,w) can take is:

$$G(d,p,w_i) = A1 \times (d-dt)^{A2} + B \times p + C1_i \times w_i^{C2_i},$$

where dt is target delay and A1 is 0 if d<dt, p is driver size properly expressed sd device width, and $w_i$ is wire pitch number. In general, the index I can run from one to the maximum number of wire planes existing on the chip. The function G(d,p,w) mathematically weights the advantage of decreasing delay, d, against the disadvantages of power expenditure, p, due to increasing driver size and the wiring track expenditure, w, due to the use of wider than minimum size wire widths. The weights in G(d,p,w) have no physical meaning in relation to chip design. They are only defined as the result of the procedure in step three above. It was found that if G(d,p,w) shows a minimum in the right place for three to five different nets, it reaches suitable results for any and all nets. The process continues in this fashion until either (1) a globally preset delay value is reached at an allowed wire width at a driver power that is even smaller than would be allowed based on optimization criteria on drivers or (2) a minimum is found in the function G(d,p,w) from the obtained sets of the parameters d, p and w. In the latter case, this may happen when the largest wire pitch value is reached, or a true minimum is found for an allowed wire.

The computer program implemented by the invention interfaces with the data depository of the VLSI chip, where the nets and the positions of the pins are specified. Also, for each net, the load values of the sinks are given or at each stage estimated. The designer can specify which nets are dealt with or can specify nets belonging to whole macros or even to the whole chip. The computer program may written any suitable computer language, such as C, and run on a workstation, such as International Business Machines' RS/6000 workstation.

The most inner loop of the program consists of calculating delay for a given combination of driver size, net configuration, and wire width. Wire widths are expressed relative to minimum pitches on each wire plane in question, which are not necessarily of the same physical width on each plane. The delay of the net is obtained by calling a separate timing algorithm. Such net timing algorithm should be able to handle with good accuracy arbitrary net configurations with resistivity, capacitance, and even inductance per unit length as parameters. The delay of the driver and the combination of the driver with net delay is again handled by calling an appropriate outside algorithm. For instance, an algorithm accomplishing these tasks is RICE developed by the University of Texas. Once the delay is calculated, the relative slope can be obtained by recalculating the delay with a driver size changed by a few percent. Changing the wire width means changing the capacitance and the resistance of the net. For any given wire width, one can always find, by iteration or other means, the driver size that gives the selected slope value. This wire width, driver size and delay comprise one set of consistent parameters to evaluate the function G(d,p,w). The combination resulting in the smallest value of the function G(d,p,w) is the optimum one, and the final parameters are written back into the chip data depository.

Figure 4:
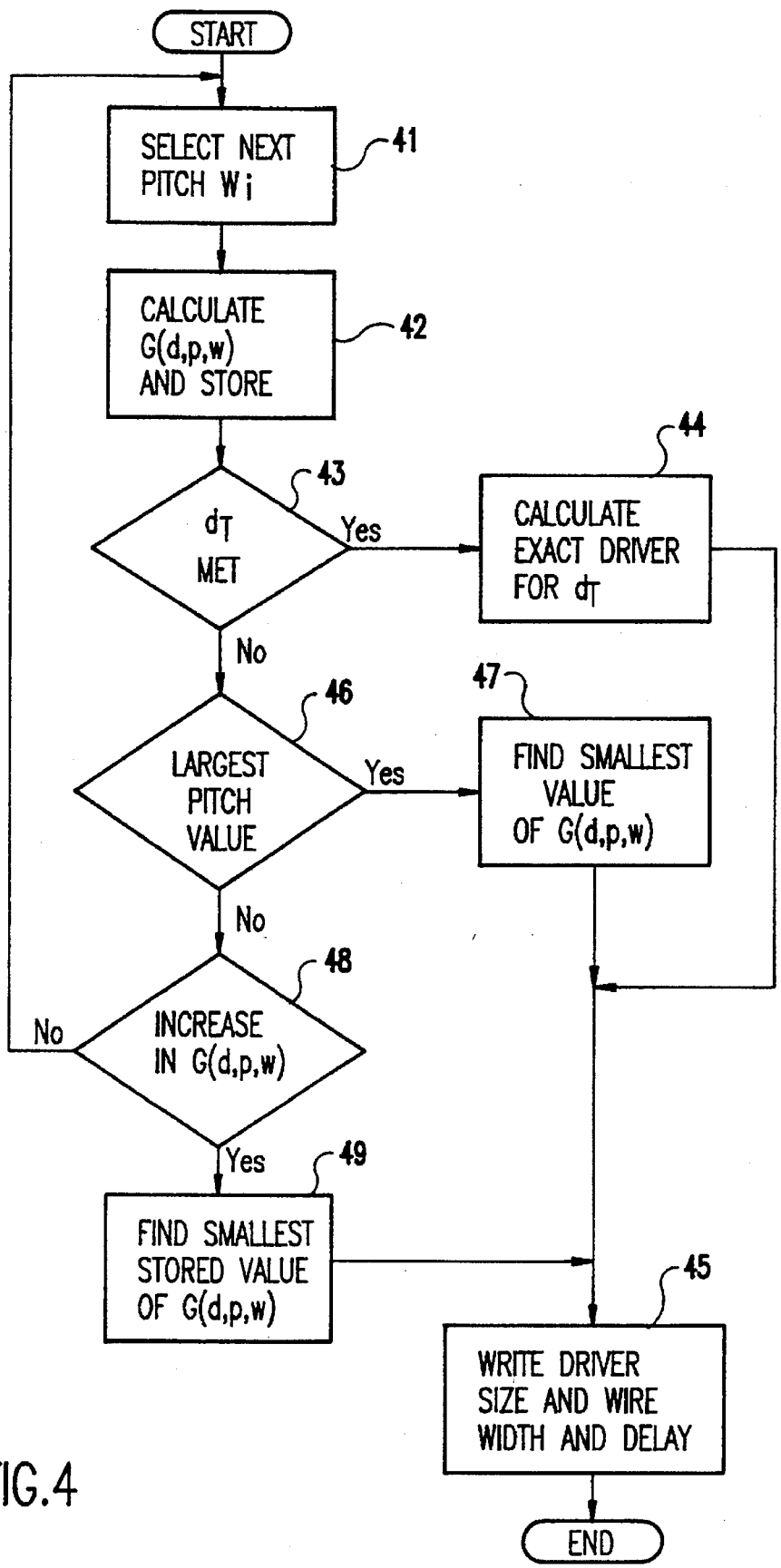
FIG. 4 is a flow diagram illustrating the logic of the program which calculates the driver size and wire width based on the design values.

There are quite a few unique features to this procedure. The computer program proceeds calculating values for the G(d,p,w) function for increasing pitches, starting with the minimum allowed by the technology. For each set wire width, the delay (at the proper slope) belonging to that particular wire width is obtained by taking process induced tolerances into account. The worst (i.e., longest) delay as obtained from tolerances is associated with the set wire width. The investigated wire width in the case of minimum pitch is the value set by the technology, but for larger than minimum pitches, the program investigates several wire and inter-wire-space combinations, called trimmings. With these explanations, the process can be summarized as follows, with reference to the flow diagram shown in FIG. 4.

In function block 41, the computer program starts at minimum pitch, and then obtains a value of the function G(d,p,w) for each trimming value (considering process tolerances) and stores it in function block 42. A test is made in decision block 43 to determine if the target delay set by the designer has been met, or exceeded. If so, the exact driver size for the target delay is calculated in function block 44. Then the program writes into the chip data depository the driver size and wire width that reached the target delay in function block 45, before the program ends for this net and starts on a new net. If not, an additional test is made in decision block 46 to determine if the largest pitch value allowed by the designer is reached. If so, the smallest of the stored values calculated for the function G(d,p,w) is found in function block 47. The d,p,w parameters of this smallest G(d,p,w) function are written to the chip data depository in function block 45 before the program starts on a new net. If the largest pitch value allowed by the designer has not been reached, a test is then made in decision block 48 to determine if the value calculated for the function G(d,p,w) has increased for three consecutive pitch values. If so, the smallest of the stored values of the function G(d,p,w) is found in function block 49, and then the d,p,w parameters of this smallest G(d,p,w) function are written to the chip data depository in function block 45 before the program starts on a new net. Otherwise, the process loops back to function block 41 to calculate the next value for the function G(d,p,w) for the next allowed pitch $w_i$.

When this is done for all the selected nets, the computer program is finished. If the designers want to change inputs, for instance by rearranging chip placements, the whole algorithm can be rerun. One net is handled in milliseconds of CPU time.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer-implemented method for determining an optimal design for wiring interconnect and driver power for a designed target delay at a chip floor planning stage in the design of very large scale integrated circuits comprising the steps of:

arriving at a decrease slope value $$\frac{\frac{\Delta d}{d}}{\frac{\Delta p}{p}}$$

based on a decrease from an ideal slope value where wire resistance is assumed to be zero and delay is that of a critical or desired delay for a given circuit technology;

finding a set of parameters w, for wire width, p, for driver power, and d, for delay, based on said decrease slope value $$\frac{\frac{\Delta d}{d}}{\frac{\Delta p}{p}};$$

generating a function G(d,p,w) which mathematically weights the advantage of decreasing delay, d, against the disadvantages of power expenditure, p, due to increasing driver size and wiring track expenditure, w, due to the use of wider than minimum size wire widths;

for a given slope decrease, finding delays for all allowed wire sizes for a few selected nets of the circuit and adjusting the slope decrease, a target delay and a maximum allowed wire width until for the few selected nets the target delay, driver size and wire width are judged satisfactory; and adjusting weights in the function G(d,p,w) such that for the few selected nets, the function G(d,p,w) has a minimum just at those delays, driver sizes and wire widths judged satisfactory.

2. The computer-implemented method recited in claim 1 further comprising the steps of:

finding all delays, wire widths and driver sizes of all nets of the circuit based on the adjusted weights of the function G(d,p,w); and determining if total chip power, total wiring and wire delay for the circuit are satisfactory and, if not, readjusting one of the input parameters and repeating the steps.

3. The computer-implemented method recited in claim 1 wherein finding the optimal d,p,w combinations comprises the steps of:

calculating the function G(d,p,w) for a set of the parameters w, p and d and storing calculated values beginning with a smallest wire pitch; and checking the stored calculated values of the function G(d,p,w) and determining if a target delay has been met for a set of the parameters w and p and, if not, determining if a largest wire pitch value for the parameter w has been reached.

4. The computer-implemented method recited in claim 3 wherein if the target delay has not been met and the largest wire pitch value has not been reached, further comprising the step of selecting a next wire pitch, and again calculating the function G(d,p,w) and storing the result and continuing this process until either (1) the target delay is reached at an allowable wire size at a driver power smaller than would be allowed on optimization criteria on drivers or (2) the largest wire pitch size value has been reached.

5. The computer-implemented method as recited in claim 4 wherein if condition (1) occurs, further comprising the step of calculating an exact driver value for the target delay and writing the calculated driver and width to a data depository, but if condition (2) occurs, then finding the smallest value of the stored calculated values of the G(d,p,w) function and then writing a delay, a driver size and a wire width of the smallest value of the G(d,p,w) function to the data depository.

6. The computer-implemented method recited in claim 3 further comprising the steps of:

determining if stored calculated values of the G(d,p,w) function have increased for a predetermined number of calculations indicating that further calculation will not yield improved delay figures; and if so, finding a smallest value of the stored calculated values of the G(d,p,w) function and then writing a delay, a driver size and a wire width of the smallest value of the G(d,p,w) function to the data depository.

7. a computer-implemented method for determining an optimal design for wiring interconnect and driver power for a designed target delay at a chip floor planning stage in the design of very large scale integrated circuits comprising the steps of:

generating an optimization function G(d,p,w) from delay, d, driver power, p, and wire width, w; and iteratively adjusting delay, driver power and wire width to achieve an optimum combination of wire width and driver size as determined by a minimum value of the optimization function G(d,p,w).

8. The computer-implemented method as recited in claim 7 wherein the optimum combination of wire width and driver size is determined based on a value of delay versus driver size slope, $$\frac{\frac{\Delta d}{d}}{\frac{\Delta p}{p}}.$$

9. The computer-implemented method recited in claim 8 wherein the delay versus drive slope value is defined in relation to an ideal slope where wire resistance is assumed to be zero and the delay is a critical or desired delay of circuit technology.

* * * * *